(12) United States Patent
Rao et al.

(10) Patent No.: US 11,670,525 B2
(45) Date of Patent: Jun. 6, 2023

(54) METHODS AND APPARATUS FOR MICROWAVE LEAKAGE REDUCTION FOR SEMICONDUCTOR PROCESS CHAMBERS

(71) Applicant: APPLIED MATERIALS, INC., Santa Clara, CA (US)

(72) Inventors: Preetham P. Rao, Singapore (SG); Ananthkrishna Jupudi, Singapore (SG); Ribhu Gautam, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 572 days.

(21) Appl. No.: 16/363,537

(22) Filed: Mar. 25, 2019

(65) Prior Publication Data

US 2019/0326141 A1   Oct. 24, 2019
US 2019/0326141 A1   Oct. 24, 2019

Related U.S. Application Data

(60) Provisional application No. 62/660,415, filed on Apr. 20, 2018.

(51) Int. Cl.
*H01L 21/67* (2006.01)
*H05B 6/76* (2006.01)
*H05B 6/64* (2006.01)

(52) U.S. Cl.
CPC ...... *H01L 21/67115* (2013.01); *H05B 6/6408* (2013.01); *H05B 6/76* (2013.01)

(58) Field of Classification Search
None
See application file for complete search history.

(56) References Cited

U.S. PATENT DOCUMENTS

| 4,475,023 | A  | * | 10/1984 | Iwabuchi | H05B 6/763 219/742 |
| 4,659,891 | A  |   | 4/1987  | Yamaguchi et al. | |
| 6,673,196 | B1 |   | 1/2004  | Oyabu | |
| 2003/0141298 | A1 |   | 7/2003  | Lee et al. | |
| 2007/0012690 | A1 | * | 1/2007  | Sim | H05B 6/763 219/741 |

(Continued)

FOREIGN PATENT DOCUMENTS

| ER | 0 763 964 A2 | 3/1997 |
| JP | 2005-032805 A | 2/2005 |
| JP | 2013-073947 A | 4/2013 |

OTHER PUBLICATIONS

Metaxas, A. C., et al., "Multimode oven applicator", Industrial Microwave Heating, IEE Power Engineering Series 4, 1983: Peter Peregrinus Ltd., pp. 147-149.

(Continued)

*Primary Examiner* — Nathaniel E Wiehe
*Assistant Examiner* — Elizabeth M Kerr
(74) *Attorney, Agent, or Firm* — Moser Taboada (57) ABSTRACT

Methods and apparatus for reducing leakage of microwaves at a slit valve of a process chamber. A multi-frequency resonant choke around the slit valve prevents microwave energy from a band of frequencies from escaping from the slit valve. The multi-frequency resonant choke may have a sloping bottom surface or a serrated bottom surface to enable multiple frequencies to resonant in the choke, canceling a range of microwave frequencies at gaps formed by a slit valve gate.

18 Claims, 6 Drawing Sheets

(56) References Cited

U.S. PATENT DOCUMENTS

| | | | |
|---|---|---|---|
| 2008/0006371 A1* | 1/2008 | Muraoka | H01J 37/32192 |
| | | | 156/345.41 |
| 2011/0290230 A1 | 12/2011 | Sim et al. | |
| 2014/0159832 A1 | 6/2014 | Einziger et al. | |
| 2015/0147894 A1 | 5/2015 | Hamano et al. | |
| 2018/0153002 A1* | 5/2018 | Carcano | H05B 6/763 |

OTHER PUBLICATIONS

Meredith, Roger, "*Microwave-heating applicators 1: multimode ovens*", Engineers Handbook of Industrial Microwave Heating, The Institution of Electrical Engineers, London, United Kingdom, 1998, pp. 181-184.

Matsumoto, K., "*An Efficient Analysis on Door Structure of a Microwave Oven Using Combined Waves of Higher Order Modes*", 33$^{rd}$ European Microwave Conference, Munich 2003, pp. 1171-1174.

Varith, J., et al., "*Design of Multimode-Circular Microwave Cavity for Agri-Food Processing*" Proceedings of Asia-Pacific Microwave Conference 2007.

Tomiyasu, Kiyo, "*Minimizing Radiation Leakage from Microwave Ovens*", IEEE Microwave Magazine, Feb. 2008.

Rocha, Ana Maria, et al., "*Simulation of Electromagnetic Leakage from a Microwave Oven*".

Fernandez, Francisco Javier Clemente, "*New Configurations and Design Technique for Multimode Microwave Filters for Use in Industrial Microwave Ovens and Other Devices*" THESIS Universidad Politecnica de Cartagena, Cartagena, Spain 2013.

Search Report for Taiwan Invention Patent Application No. 108113332, dated May 19, 2020.

International Search Report for PCT/US2019/026929, dated Jul. 29, 2019.

\* cited by examiner

METHODS AND APPARATUS FOR MICROWAVE LEAKAGE REDUCTION FOR SEMICONDUCTOR PROCESS CHAMBERS

CROSS-REFERENCE TO RELATED APPLICATIONS

This application claims benefit of U.S. provisional patent application Ser. No. 62/660,415, filed Apr. 20, 2018 which is herein incorporated by reference in its entirety.

FIELD

Embodiments of the present principles generally relate to semiconductor process chambers.

BACKGROUND

Microwaves are used in semiconductor processing, for example, to anneal, clean, cure, and degas. The microwaves are generated outside of the process chamber and a waveguide is used to transmit the microwaves into the chamber. The chamber has a substrate support to hold wafers while being processed. The microwaves can be used to process a single wafer and/or multiple wafers in a batch. Microwaves entering the chamber during processing will propagate out of the chamber wherever there is a gap between metallic surfaces. Some chambers have a slit valve with a door or valve gate to allow the insertion and removal of wafers from the chamber. Often the valve gate allows microwaves to leak out of the chamber. Non-metallic gaskets on the valve door that provide a seal for creating a vacuum in the chamber are transparent to microwaves. Metallic gaskets have been used to prevent microwave leakage, but the metallic gaskets are prone to failure and require high levels of maintenance.

Accordingly, the inventors have developed a way to reduce microwave leakage from the semiconductor process chamber at the valve gate.

SUMMARY

Methods and apparatus provide microwave leak prevention in semiconductor process chambers.

In some embodiments, an apparatus for reducing microwave leakage from a process chamber comprises a slit valve with a slit valve gate and a slot perpendicular to a gap between the slit valve and the slit valve gate, the slot having a bottom with a varying surface such that a range of microwave frequencies resonate in the slot.

In some embodiments the apparatus may further include wherein the varying surface has a linear slope with a highest point causing resonance of a highest resonating frequency of the slot and a lowest point causing resonance of a lowest resonating frequency of the slot; wherein the varying surface has serrations with highest peaks of the serrations causing resonance of a highest resonating frequency of the slot and valleys of the serrations causing resonance of a lowest resonating frequency of the slot; wherein the serrations are formed separately from the slot and inserted into the slot; wherein a width of the slot is less than a wavelength of a highest resonant frequency of the slot; wherein the slot is formed in the slit valve; wherein the slot has an L-shape where a total length of the slot through a mid-point of the L-shape is a quarter of a wavelength of a frequency that resonates in the slot; wherein the slot is straight and formed into material of the slit valve; wherein the slot is straight and formed by a gap between material of the slit valve and a second element inserted into an opening of the slit valve; wherein the second element is formed from sheet metal; wherein the slot is formed in the slit valve gate; and/or wherein the slot is formed inward of a vacuum seal for the slit valve gate or formed behind a vacuum seal for the slit valve gate.

In some embodiments, an apparatus for reducing microwave leakage from a process chamber comprises a process chamber having a substrate support in an inner volume; a slit valve disposed in a wall of the process chamber, the slit valve having a slit valve opening for inserting and removing substrates from the substrate support and a slit valve gate for sealing the process chamber; and a recess cavity in the slit valve that surrounds the slit valve opening, the recess cavity having a varying surface on a bottom of the recess cavity.

In some embodiments, the apparatus may further include wherein the recess cavity is located inward of vacuum gasket for the slit valve gate towards the opening of the slit valve gate; wherein the varying surface has serrations with highest peaks of the serrations causing resonance of a highest resonating frequency of the recess cavity and valleys of the serrations causing resonance of a lowest resonating frequency of the recess cavity; wherein peaks of the serrations are approximately 11.2 mm deep from an opening surface of the recess cavity and valleys of the serrations are approximately 12.8 mm deep from the opening surface of the recess cavity; wherein the serrations are formed separately from the recess cavity and inserted into the recess cavity; and/or wherein the recess cavity has a width of greater than zero to less than a wavelength of a highest resonant frequency of the recess cavity.

In some embodiments, an apparatus for reducing microwave leakage from a process chamber comprises a process chamber having a substrate support in an inner volume; a slit valve disposed on a wall of the process chamber, the slit valve having a slit valve opening for inserting and removing substrates from the substrate support and a slit valve gate for sealing the process chamber; a first separable element having an annular shape inserted into the slit valve opening and mating with the slit valve, the first separable element forming one wall of a choke cavity, the slit valve forming another wall of the choke cavity and a bottom surface of the choke cavity; and a second separable element having an annular shape inserted into the choke cavity with a bottom surface mating with the slit valve at the bottom surface of the choke cavity, the second separable element having serrations on a top surface providing a varying bottom surface of the choke cavity.

In some embodiments, the apparatus may further include wherein peaks of the serrations are approximately 11.2 mm deep from an opening surface of the choke cavity and valleys of the serrations are approximately 12.8 mm deep from the opening surface of the choke cavity.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Microwave leakage from semiconductor chambers can cause safety and production issues. Metal gaskets used to prevent microwave leakage from slit valves often cause arcing between the mating surfaces and the metal gaskets, especially if foreign material becomes lodged in the metal gaskets. In addition, the constant contact between the metal gaskets and the surfaces causes wear and particle generation, affecting performance of the gasket and defects in the substrate processing. The inventors have discovered non-contact apparatus and methods that outperform metal gaskets in both safety and production areas. The apparatus and methods, according to the present principles, advantageously increases safety of operators by reliably reducing microwave leakage and function without contacting surfaces, reducing maintenance and wear, reducing particle generation, and reducing arcing like metallic gaskets. The apparatus and methods also advantageously can function in conjunction with other process chamber seals such as vacuum seals and the like that are microwave transparent. With some embodiments, legacy equipment can be cost-effectively altered, allowing safety upgrades without having to purchase replacement equipment. Many process chamber heating cycles switch frequencies approximately every 100 microseconds to keep heating uniform. The apparatus and methods are also able to prevent microwave leakage over a band of operating frequencies rather than a single microwave frequency, advantageously permitting much greater flexibility and cost effectiveness.

A microwave, when presented with a gap, will leak through the gap unless the microwave is diverted into a path that causes the microwave to be reflected back at the end of the path. The reflected microwave will cancel the incoming microwave if the distance of the path is the wavelength, lambda ($\lambda$), divided by four ($\lambda/4$). If the distance is $\lambda/4$, then the microwave travels a total distance of $\lambda/2$ by traveling down ($\lambda/4$) and back ($\lambda/4$). When the reflected microwave meets an incoming wave at ½ wavelength apart, the microwaves cancel each other out. A path equal to $\lambda/4$ is referred to as a quarter wave resonant choke. The inventors have discovered techniques based on the present principles to incorporate resonant chokes operating over a band of frequencies into semiconductor process chambers to replace metal gaskets.

The inventors have found that the resonant chokes, according the present principles, are safer and work more efficiently over multiple frequencies. To eliminate losses in any of the frequencies in a band, leakage has to be reduced for frequencies in the band, especially frequencies with longer wavelengths. Longer wavelengths escape easier and propagate farther and also penetrate into objects deeper, causing more harm. The depth of the choke controls the reflection and the cancellation for a single frequency. The inventors have discovered ways to provide varying depths in a single choke to allow the choke to function over an entire band of frequencies. In some embodiments (discussed, e.g., for FIGS. 4, 9, and 10), serrations are used to alter the depth of the choke over a wide number of frequencies. The inventors have found that the greater the number of serrations, the higher the performance of the choke, resulting in less microwave leakage. In some embodiments, the serrations run perpendicular to a length of a slot or recess of a choke. In some embodiments (discussed, e.g., for FIG. 3), a slope is used to alter the depth of the choke over a wide number of frequencies. The inventors have found that the width of the choke may be less than the wavelength of the frequency being canceled to several orders of magnitude less than the wavelength of the frequency being canceled without substantially impacting the performance of the choke. In addition, the inventors have found that the serrations provide better leakage control than a slope because the serrations provide more frequency attenuation over a wide band of frequencies for a given amount of space (a serration affects the frequencies in the band and more serrations can be placed in a given amount of space than a slope).

Figure 1:
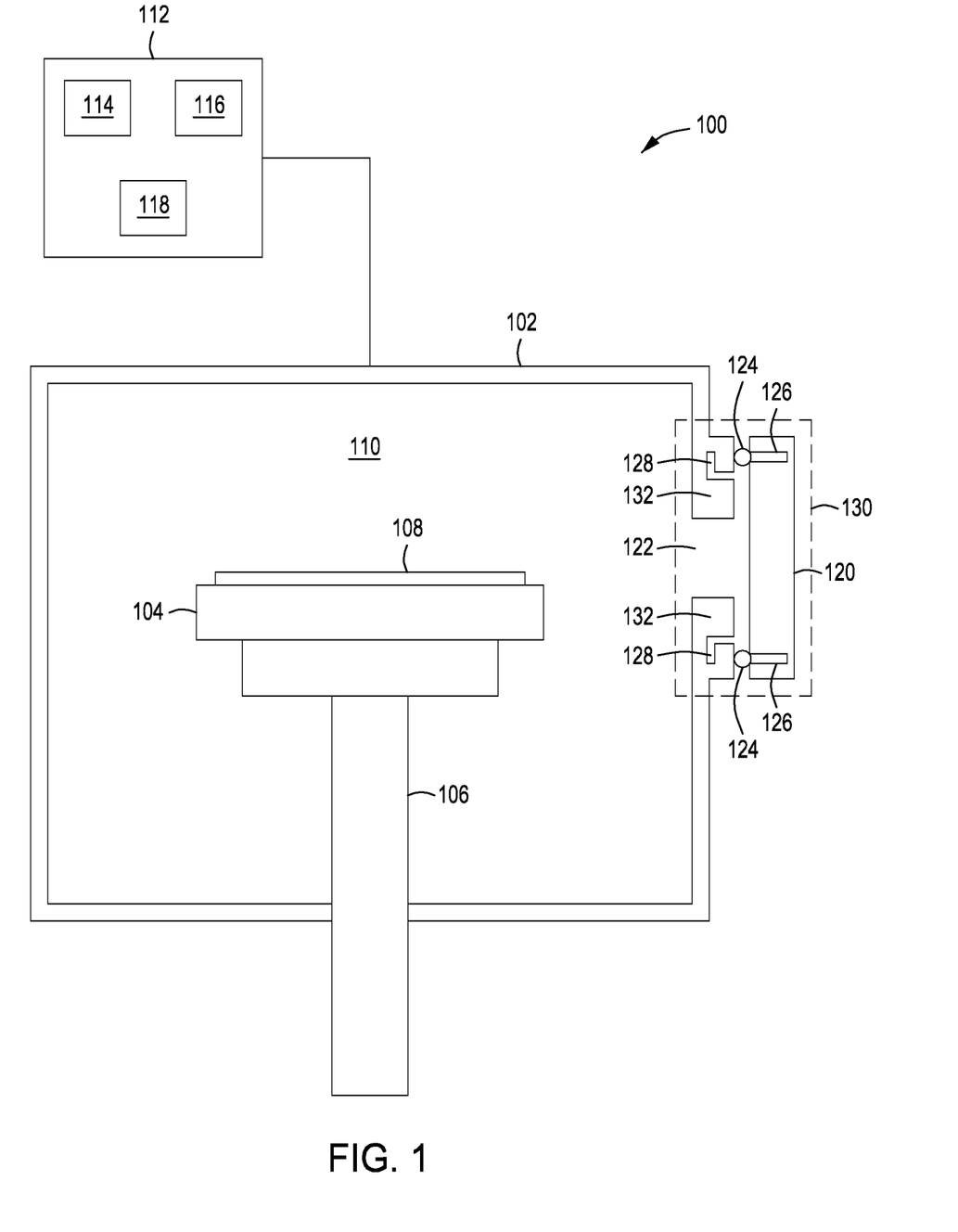
FIG. 1 depicts a view of a process chamber with a slit valve assembly in which an apparatus for reducing microwave leakage may be employed or a method of reducing microwave leakage may be performed in accordance with some embodiments of the present principles.

FIG. 1 depicts a process chamber 100 with a slit valve assembly 130 in which an apparatus for reducing microwave leakage may be employed or a method of reducing microwave leakage may be performed in accordance with some embodiments. In FIG. 1, the slit valve assembly 130 may include a slit valve opening 122 in a slit valve body 132 and a slit valve gate 120 that seals off the slit valve opening 122. A gasket 124 may provide a vacuum seal between the slit valve gate 120 and the slit valve body 132. While the gasket 124 provides a vacuum seal, the gasket 124 is microwave transparent and does not prevent microwave leakage. The slit valve assembly 130 provides a way to insert and remove substrates 108 from a substrate support 104 in an inner volume 110 of the process chamber 100. The slit valve opening 122 provides access to the inner volume 110 of the process chamber 100 through a wall 102 of the process chamber 100. The substrate support 104 includes a support assembly 106 which supports the substrate support 104 and also provides electrical connections and/or cooling liquids, etc. In some embodiments, the slit valve assembly 130 may optionally include L-shaped resonant chokes 128 in the slit valve body 132 discussed in further detail for FIG. 2. In some embodiments, the slit valve assembly 130 may optionally include linear resonant chokes 126 in the slit valve gate 120 discussed in further detail for FIG. 2.

The process chamber 100 may include a process controller 112 that includes a central processing unit (CPU 114), memory 116, and/or support circuits 118. The process controller 112 may provide control of the slit valve assembly 130. The process chamber 100 may be utilized alone or as a processing module of an integrated semiconductor substrate processing system, or cluster tool, such as a ENDURA® integrated semiconductor substrate processing system, available from Applied Materials, Inc. of Santa Clara, Calif. The process chamber 100 may be a drying chamber or a PVD chamber such as the CHARGER™ Under Bump Metallization (UBM) PVD chamber also available from Applied Materials, Inc. Other process chambers and/or cluster tools may suitably be used as well.

Figure 2:
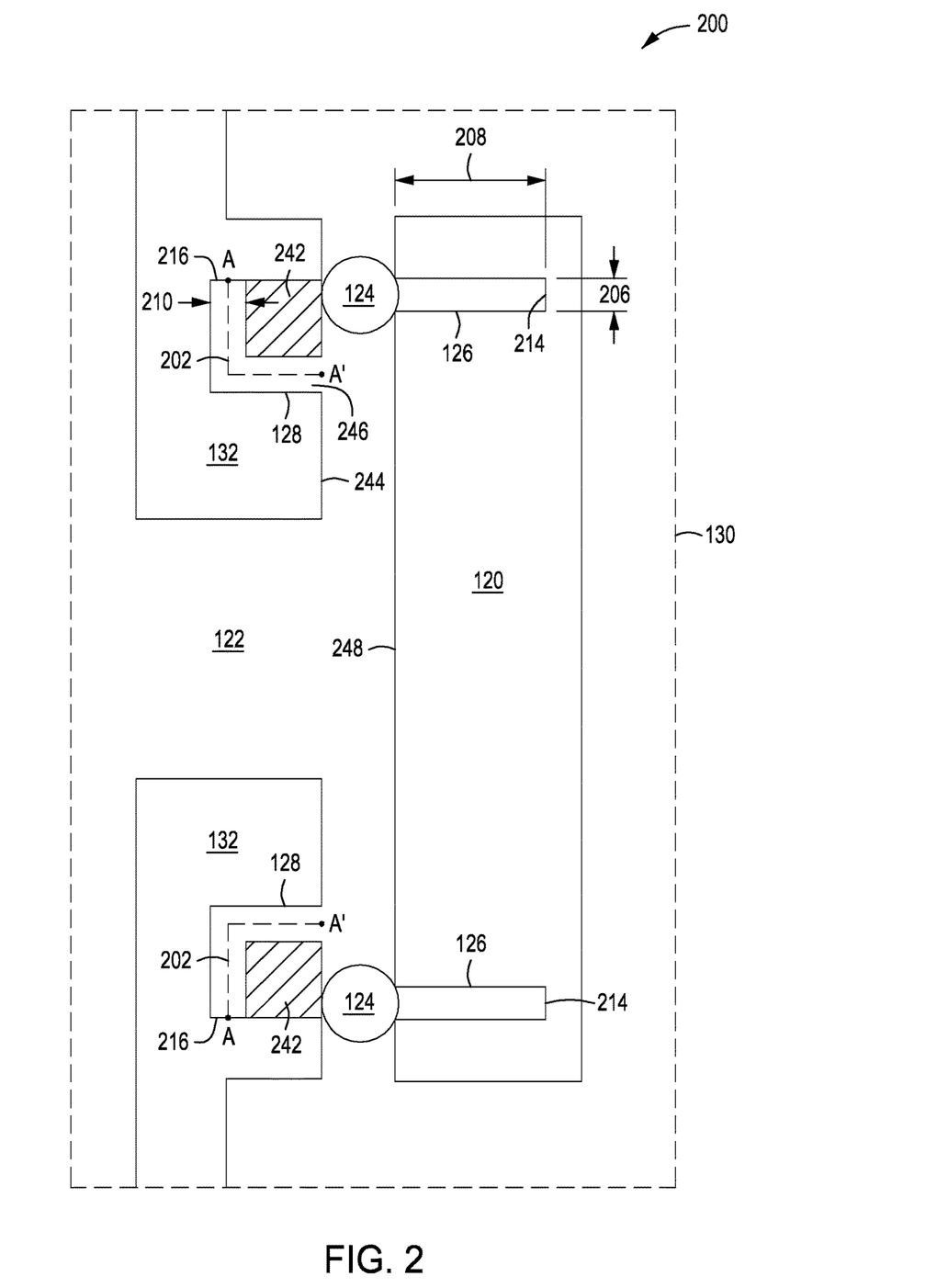
FIG. 2 depicts a cross-sectional view of an enlarged view of the slit valve assembly of FIG. 1 in accordance with some embodiments of the present principles.

Because the gasket 124 is microwave transparent, resonant chokes are introduced into the slit valve assembly 130 to prevent microwave leakage. FIG. 2 depicts an enlarged view 200 of the slit valve assembly 130 of FIG. 1 in accordance with some embodiments. In some embodiments, the L-shaped resonant choke 128 is formed in the slit valve body inward of the gasket 124 and outward of the slit valve opening 122. To reduce complicated machining, the L-shaped resonant choke 128 may optionally be formed as an annular rectangular slot around the slit valve opening 122 in the slit valve body 132 with a smaller annular rectangular insert 242 that forms the L-shape. The total distance from a surface 244 of an opening 246 to a bottom 216 through a mid-point of the L-shaped resonant choke 128 is represented by a line 202. The line 202 starts at the opening 246 and ends at the bottom 216 at points A' and A, respectively. The line 202 has a total length of a quarter of the wavelength of a frequency canceled by the L-shaped resonant choke 128. A width 210 of the L-shaped resonant choke 128 may be several orders of magnitude less than the resonant wavelength of the L-shaped resonant choke 128.

In some embodiments, the linear resonant choke 126 is formed in the slit valve gate 120. In some embodiments, the linear resonant choke 126 may be formed behind the gasket 124 as illustrated in FIG. 2. A depth 208 of the linear resonant choke 126 from a surface 248 of the slit valve gate 120 to a bottom 214 of the linear resonant choke 126 is a quarter of the wavelength of a frequency canceled by the linear resonant choke 126. A width 206 of the linear resonant choke 126 may be several orders of magnitude less than the resonant wavelength of the linear resonant choke 126. The gasket 124 does not interfere with the linear resonant choke 126 because the gasket 124 is microwave transparent.

Figure 3:
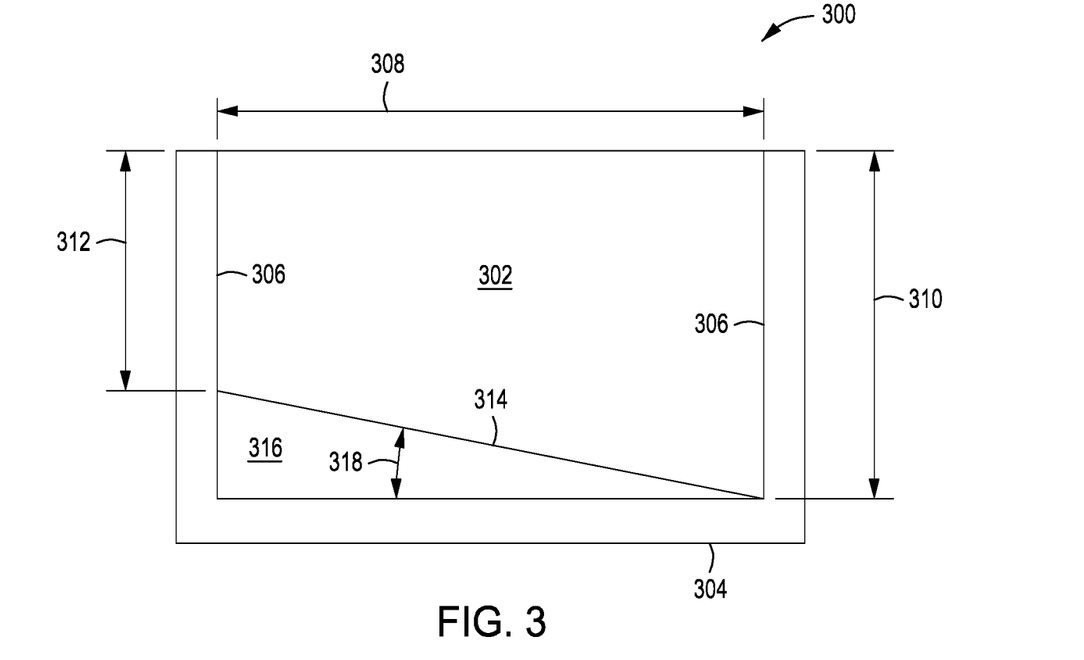
FIG. 3 depicts a cross-sectional view of a bottom of a choke with a slope in accordance with some embodiments of the present principles.

FIG. 3 depicts a cross-sectional view 300 of a bottom 316 of a choke 302 with a slope 314 in accordance with some embodiments. The choke 302 may be, for example, the linear resonant choke 126 of FIG. 2 and/or the L-shaped resonant choke 128 of FIG. 2 or another choke. The proportions of the choke 302 are distorted to allow for more detail to be shown in regard to the bottom 316 of the choke 302. In some embodiments, the choke 302 may have sidewall surfaces 306 and the bottom 316 will have a slope 314 that is linear. The slope 314 creates varying depths on the bottom 316 of the choke 302 from a smallest depth 312 to a largest depth 310. The slope 314 of the bottom 316 makes the choke 302 resonate at different frequencies due to the varying bottom. The smallest depth 312 dictates the highest frequency (highest frequency=1/(4×smallest depth)) that will resonate in the choke 302 and the largest depth 310 dictates the lowest frequency (lowest frequency=1/(4×largest depth)) that will resonate in the choke 302. Frequencies between the highest and lowest frequencies will also resonate in the choke 302. The slope 314 advantageously allows the choke 302 to operate over a band of frequencies rather than a single frequency, allowing a single choke to cover multiple applications, substantially reducing costs and increasing flexibility.

In some embodiments, the choke 302 resonates for frequencies from 5.85 GHz to 6.69 GHz with a smallest depth 312 of 11.2 mm and a largest depth 310 of 12.8 mm. In some embodiments, adjustments can be made in an angle 318 of the slope 314 to adjust the depths and the covered frequency band. A width 308 of the choke 302 may be several magnitudes less than the wavelengths of the frequency band operated on by the choke 302. In some embodiments, the width 308 is approximately 1.0 mm. In some embodiments, the width 308 may be a range from greater than zero to less than a wavelength of a highest resonant frequency of the choke. In some embodiments, the width 308 is several orders of magnitude less than the wavelength of the highest resonant frequency of the choke. In some embodiments, the choke 302 may be disposed in a material 304 in a slit valve gate 120 or in a slit valve body 132 (see e.g., FIG. 2). In some embodiments, the bottom 316 may be part of the material 304 (machined out of the material 304 or formed in the material 304, etc.). In some embodiments, the bottom 316 may be a separable element that is first formed and then placed or inserted into a cavity or recess that forms the choke 302. By forming the bottom 316 as a separable element, machining and production costs may be substantially reduced, saving both time and expenses.

Figure 4:
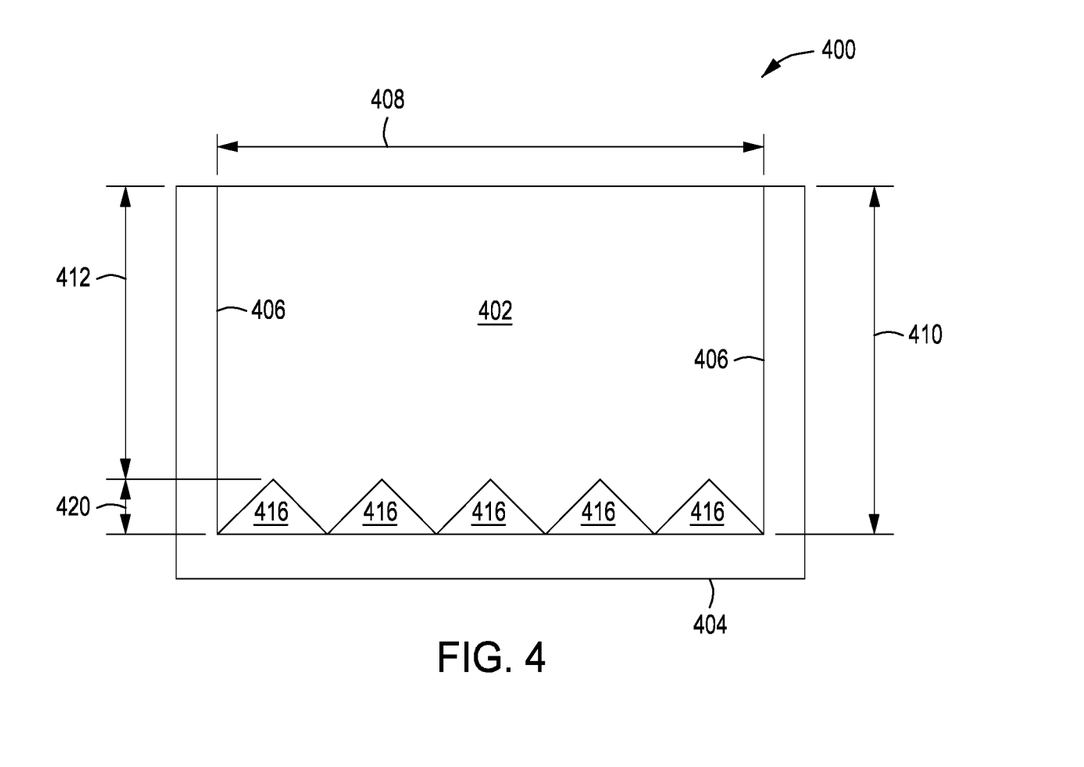
FIG. 4 depicts a cross-sectional view of a bottom of a choke with serrations in accordance with some embodiments of the present principles.

FIG. 4 depicts a cross-sectional view 400 of a bottom 418 of a choke with serrations in accordance with some embodiments. The choke 402 may be, for example, the linear resonant choke 126 of FIG. 2 or the L-shaped resonant choke 128 of FIG. 2. The proportions of the choke 402 are distorted to allow for more detail to be shown in regard to the bottom 418 of the choke 402. In some embodiments, the choke 402 may have sidewall surfaces 406 and the bottom 418 will have serrations 416. The serrations 416 create varying depths on the bottom 418 of the choke 402 from a smallest depth 412 to a largest depth 410. The serrations 416 of the bottom 418 make the choke 402 resonate at different frequencies due to the varying bottom. The smallest depth 412 dictates the highest frequency (highest frequency=1/(4× smallest depth)) that will resonate in the choke 402 and the largest depth 410 dictates the lowest frequency (lowest frequency=1/(4×largest depth)) that will resonate in the choke 402. Frequencies between the highest and lowest frequencies will also resonate in the choke 402.

In some embodiments, the choke 402 resonates for frequencies from 5.85 GHz to 6.69 GHz with a smallest depth 412 of 11.2 mm and a largest depth 410 of 12.8 mm (serration height of 1.6 mm). The serrations 416 advantageously allow the choke 402 to operate over a band of frequencies rather than a single frequency, allowing a single choke to cover multiple applications, substantially reducing costs and increasing flexibility. Adjustments can be made in a height 420 of the serrations 416 to adjust the covered frequency band. A width 408 of the choke 402 may be several magnitudes less than the wavelengths of the frequency band operated on by the choke 402. In some embodiments, the width 408 is approximately 1.0 mm. In some embodiments, the width 408 may be a range from greater than zero to less than a wavelength of a highest resonant frequency of the choke. In some embodiments, the width 408 is several orders of magnitude less than the wavelength of the highest resonant frequency of the choke. In some embodiments, the choke 402 may be disposed in a material 404 in a slit valve gate 120 or in a slit valve body 132 (see e.g., FIG. 2). In some embodiments, the serrations 416 may be part of the material 404 (machined out of the material 404 or formed in the material 404, etc.). In some embodiments, the serrations 416 may be a separable element that is first formed and then placed or inserted into a cavity or recess that forms the choke 402. By forming the serrations 416 as a separable element, machining and production costs may be substantially reduced, saving both time and expenses.

Figure 5:
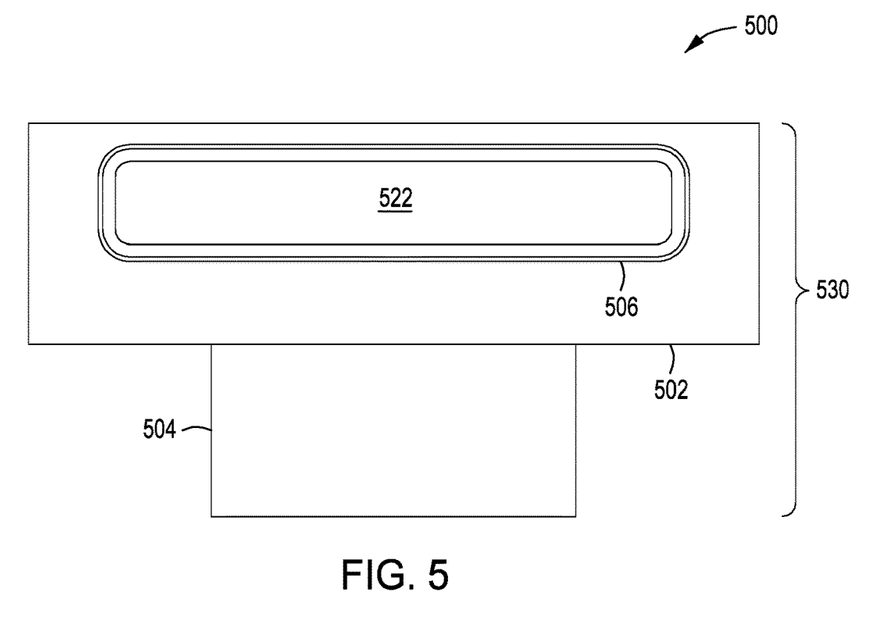
FIG. 5 depicts a front view of a choke around a slit valve opening in accordance with some embodiments of the present principles.

FIG. 5 depicts a front view 500 of a choke 506 around a slit valve opening 522 in accordance with some embodiments. The slit valve assembly 530 may include a slit valve body 502 with the slit valve opening 522 and a slit valve gate actuator 504. In some embodiments, the choke 506 is located outward of and surrounding the slit valve opening 522. The choke 506 in FIG. 5 may be a slot, recess, or cavity in the slit valve body 502 of dimensions capable of resonating at an appropriate band of frequencies. In some embodiments, the choke 506 may be a linear resonant choke and/or an L-shaped resonant choke in the slit valve body 502.

Figure 6:
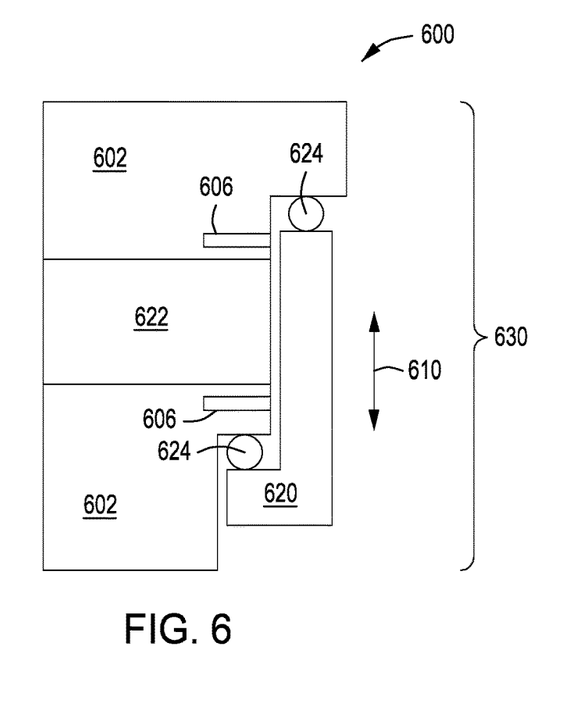
FIG. 6 depicts a cross-sectional view of a slit valve assembly in accordance with some embodiments of the present principles.

FIG. 6 depicts a cross-sectional view 600 of a slit valve assembly 630 in accordance with some embodiments. The slit valve assembly 630 includes a slit valve body 602 with a slit valve opening 622 and a slit valve gate 620. A choke 606 is located outward of the slit valve opening 622 and inward of a gasket 624. The gasket 624 seals the slit valve gate 620 against the slit valve body 602 to allow for a gas tight seal (e.g., to allow the chamber to hold a vacuum, etc.). The gasket 624 is microwave transparent and does not prevent microwave leakage. The slit valve gate 620 may be raised and lowered (arrow 610) by a slit valve gate actuator (see FIG. 5). The choke 606 may be formed and/or machined into the slit valve body 602 as a single piece and/or as multiple pieces such as with a separate piece to create a variable bottom as described in FIGS. 3 and 4.

Figure 7:
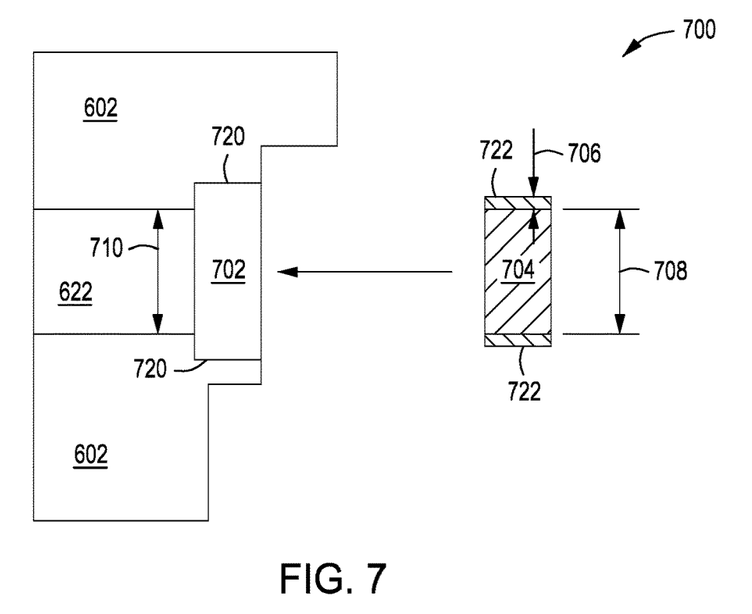
FIG. 7 depicts a cross-sectional view of an annular element for creating the choke of FIG. 6 in accordance with some embodiments of the present principles.
Figure 8:
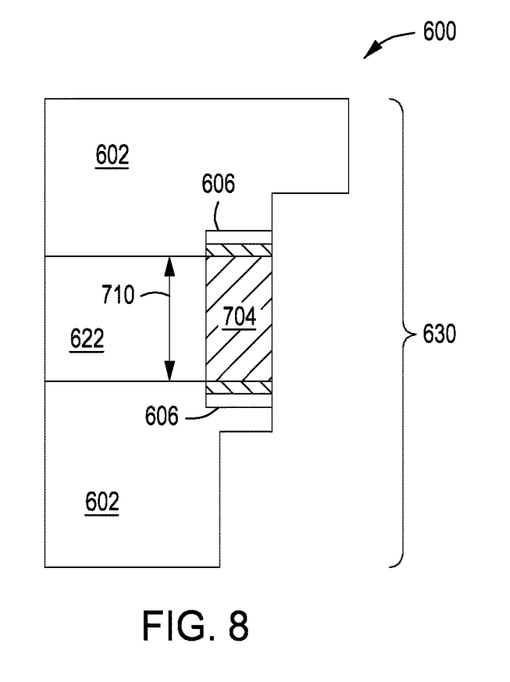
FIG. 8 depicts a cross-sectional view of the annular element of FIG. 7 installed in the slit valve assembly in accordance with some embodiments of the present principles.

FIG. 7 depicts a cross-sectional view 700 of an apparatus for creating a choke of FIG. 6 in accordance with some embodiments. The slit valve body 602 is formed and/or machined to create a space 702 around the slit valve opening 622. Outer surfaces 720 of the space 702 will form outer walls of the choke 606. An annular element 704 is formed by stamping and/or machining and the like. The annular element 704 has inner dimensions 708 that are approximately similar to inner dimensions 710 of slit valve opening 622 of the slit valve body 602. An outer surface 722 of the annular element 704 will form an inner wall of the choke 606. A thickness 706 of the annular element 704 may be altered to adjust a width of the choke 606. FIG. 8 depicts a cross-sectional view 800 of the annular element 704 of FIG. 7 installed in the slit valve assembly 630 in accordance with some embodiments. With the insertion of the annular element 704 into the slit valve body 602, the choke 606 is formed with inner walls provided by the annular element 704 and outer walls and bottom provided by the slit valve body 602. In some embodiments, the annular element 704 may also provide a varying bottom for the choke 606 (see FIGS. 3 and 4 for different embodiments of a varying bottom for a choke). In some embodiments, the varying bottom may be another annular element (see FIG. 9).

Figure 9:
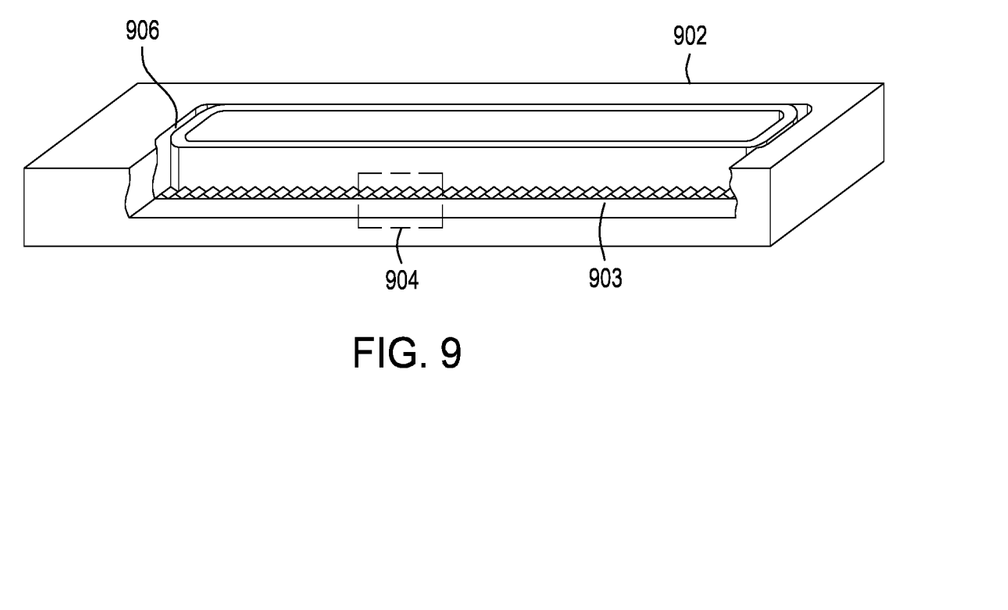
FIG. 9 depicts an isometric cut-away view of a portion of a slit valve with an annular element for creating serrations in a choke cavity in accordance with some embodiments of the present principles.
Figure 10:
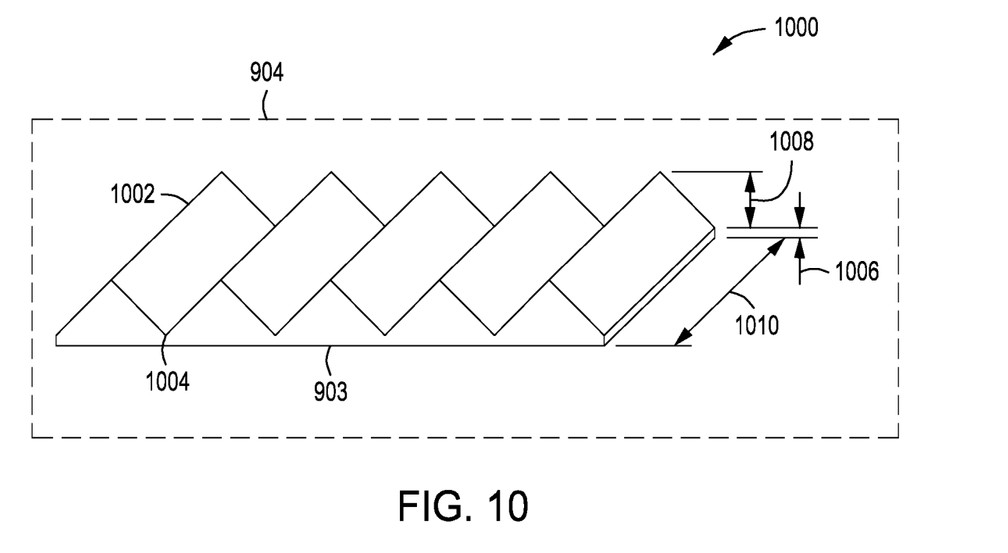
FIG. 10 depicts an isometric view of a portion of the annular element of FIG. 9 in accordance with some embodiments of the present principles.

FIG. 9 depicts an isometric cut-away view 900 of a portion of a slit valve 902 with an annular element 903 for creating serrations in a choke cavity 906 in accordance with some embodiments. The annular element 903 forms a varying bottom for insertion into a recess, cavity, or slot to create a resonant choke over a band of frequencies. In some embodiments, the annular element 903 comprises serrations. A portion 904 of the annular element 903 is depicted in the isometric view 1000 of FIG. 10. The portion 904 illustrates serrations with peaks 1002 and valleys 1004. A height 1008 of the peaks 1002 and/or spacing of the peaks may be varied to increase or decrease the highest frequency of a band of resonating frequencies of a choke. The annular element 903 may have a thickness 1006 to enable the annular element 903 to be handled and to facilitate in inserting the annular element 903 into a bottom of a slot, cavity, or recess for a choke. A width 1010 of the annular element 903 is approximately the width of the choke cavity 906.

While the foregoing is directed to embodiments of the present principles, other and further embodiments of the principles may be devised without departing from the basic scope thereof.

The invention claimed is:

1. An apparatus for reducing microwave leakage from a process chamber, comprising:
a slit valve with a slit valve gate; and
a choke cavity perpendicular to a gap between the slit valve and the slit valve gate, the choke cavity having a varying bottom surface, wherein the varying bottom surface has serrations with highest peaks of the serrations causing resonance of a highest resonating frequency of the choke cavity and valleys of the serrations causing resonance of a lowest resonating frequency of the choke cavity, and wherein all frequencies between the highest resonating frequency and the lowest resonating frequency also resonate in the choke cavity.

2. The apparatus of claim 1, wherein the serrations are formed separately from the choke cavity and inserted into the choke cavity.

3. The apparatus of claim 1, wherein a width of the choke cavity is greater than zero and less than a wavelength of a highest resonant frequency of the choke cavity.

4. The apparatus of claim 1, wherein the choke cavity is formed in the slit valve.

5. The apparatus of claim 4, wherein the choke cavity has an L-shape where a total length of the choke cavity through a mid-point of the L-shape is a quarter of a wavelength of a frequency that resonates in the choke cavity.

6. The apparatus of claim 4, wherein the choke cavity is straight and formed into material of the slit valve.

7. The apparatus of claim 4, wherein the choke cavity is straight and formed by a gap between material of the slit valve and a second element inserted into an opening of the slit valve.

8. The apparatus of claim 7, wherein the second element is formed from sheet metal.

9. The apparatus of claim 1, wherein the choke cavity is formed in the slit valve gate.

10. The apparatus of claim 9, wherein the choke cavity is formed inward of a vacuum seal for the slit valve gate or formed behind a vacuum seal for the slit valve gate.

11. An apparatus for reducing microwave leakage from a process chamber, comprising:
the process chamber having a substrate support in an inner volume;
a slit valve disposed in a wall of the process chamber, the slit valve having a slit valve opening for inserting and removing substrates from the substrate support and a slit valve gate for sealing the process chamber; and a choke cavity in the slit valve that surrounds the slit valve opening, wherein the choke cavity has a varying bottom surface, wherein the varying bottom surface has serrations with highest peaks of the serrations causing resonance of a highest resonating frequency of the choke cavity and valleys of the serrations causing resonance of a lowest resonating frequency of the choke cavity, and wherein all frequencies between the highest resonating frequency and the lowest resonating frequency also resonate in the choke cavity.

12. The apparatus of claim 11, wherein the choke cavity is located inward of a vacuum gasket for the slit valve gate towards the slit valve opening of the slit valve.

13. The apparatus of claim 11, wherein the choke cavity resonates at a frequency of 5.85 GHz to a frequency of 6.69 GHz and all frequencies therebetween.

14. The apparatus of claim 11, wherein peaks of the serrations are 11.2 mm deep from an opening surface of the choke cavity and valleys of the serrations are 12.8 mm deep from the opening surface of the choke cavity.

15. The apparatus of claim 11, wherein the serrations are formed separately from the choke cavity and inserted into the choke cavity.

16. The apparatus of claim 11, wherein the choke cavity has a width of greater than zero to less than a wavelength of a highest resonant frequency of the choke cavity.

17. An apparatus for reducing microwave leakage from a process chamber, comprising:
the process chamber having a substrate support in an inner volume;
a slit valve disposed on a wall of the process chamber, the slit valve having a slit valve opening for inserting and removing substrates from the substrate support and a slit valve gate for sealing the process chamber;
a first separable element having an annular shape inserted into the slit valve opening and mating with the slit valve, the first separable element forming one wall of a choke cavity, the slit valve forming another wall of the choke cavity and a bottom surface of the choke cavity; and
a second separable element having an annular shape inserted into the choke cavity with a bottom surface mating with the slit valve at the bottom surface of the choke cavity, the second separable element having serrations on a top surface providing a varying bottom surface of the choke cavity, wherein the varying bottom surface has serrations with highest peaks of the serrations causing resonance of a highest resonating frequency of the choke cavity and valleys of the serrations causing resonance of a lowest resonating frequency of the choke cavity, and wherein all frequencies between the highest resonating frequency and the lowest resonating frequency also resonate in the choke cavity.

18. The apparatus of claim 17, wherein peaks of the serrations are 11.2 mm deep from an opening surface of the choke cavity and valleys of the serrations are 12.8 mm deep from the opening surface of the choke cavity.

* * * * *